United States Patent
Hasebe et al.

(10) Patent No.: US 8,343,594 B2
(45) Date of Patent: Jan. 1, 2013

(54) FILM FORMATION METHOD AND APPARATUS FOR SEMICONDUCTOR PROCESS

(75) Inventors: Kazuhide Hasebe, Minamialps (JP); Mitsuhiro Okada, Kai (JP); Chaeho Kim, Suwon (KR); Byounghoon Lee, Yongin (KR); Pao-Hwa Chou, Kai (JP)

(73) Assignee: Tokyo Electron Limited, Tokyo (JP)

( * ) Notice: Subject to any disclaimer, the term of this patent is extended or adjusted under 35 U.S.C. 154(b) by 938 days.

(21) Appl. No.: 12/167,270

(22) Filed: Jul. 3, 2008

(65) Prior Publication Data

US 2008/0274302 A1 Nov. 6, 2008

Related U.S. Application Data

(62) Division of application No. 11/367,339, filed on Mar. 6, 2006, now abandoned.

(30) Foreign Application Priority Data

Mar. 11, 2005 (JP) .................................. 2005-070034
Jan. 11, 2006 (JP) .................................. 2006-004192

(51) Int. Cl.
*H05H 1/24* (2006.01)
(52) U.S. Cl. ........................................ 427/579; 427/569
(58) Field of Classification Search .................. 427/569, 427/579
See application file for complete search history.

(56) References Cited

U.S. PATENT DOCUMENTS

| | | | |
|---|---|---|---|
| 3,721,583 A | 3/1973 | Blakeslee et al. | |
| 5,040,046 A * | 8/1991 | Chhabra et al. | 257/635 |
| 5,225,378 A | 7/1993 | Ushikawa | |
| 5,658,417 A | 8/1997 | Watanabe et al. | |
| 5,989,345 A | 11/1999 | Hatano | |
| 6,815,350 B2 | 11/2004 | Kim et al. | |
| 6,905,549 B2 | 6/2005 | Okuda et al. | |
| 2002/0160125 A1 | 10/2002 | Johnson et al. | |
| 2003/0189208 A1 * | 10/2003 | Law et al. | 257/72 |
| 2004/0115584 A1 | 6/2004 | Okabe | |
| 2005/0095770 A1 * | 5/2005 | Kumagai et al. | 438/202 |

FOREIGN PATENT DOCUMENTS

| | | |
|---|---|---|
| CN | 1549872 A | 11/2004 |
| JP | 62-62529 | 3/1987 |
| JP | 62-156822 | 7/1987 |
| JP | 01-251725 | * 10/1989 |
| JP | 5-51747 | 3/1993 |
| JP | 6-314660 | 11/1994 |
| JP | 8-330293 | 12/1996 |

(Continued)

*Primary Examiner* — Kelly M Gambetta
(74) *Attorney, Agent, or Firm* — Oblon, Spivak, McClelland, Maier & Neustadt, L.L.P.

(57) ABSTRACT

A film formation apparatus for a semiconductor process includes a process gas supply system configured to supply process gases. The process gas supply system includes a gas mixture tank configured to mix first and third process gases to form a mixture gas, a mixture gas supply line configured to supply the mixture gas from the gas mixture tank to a process field, a second process gas supply circuit having a second process gas supply line configured to supply a second process gas to the process field without passing through the gas mixture tank, and first and second switching valves disposed on the mixture gas supply line and the second process gas supply line, respectively. A control section controls the first and second switching valves to be opened and closed so as to alternately and pulse-wise supply the mixture gas and the second process gas to the process field.

14 Claims, 5 Drawing Sheets

FOREIGN PATENT DOCUMENTS

| | | |
|---|---|---|
| JP | 2000-58527 | 2/2000 |
| JP | 2002-134497 | 5/2002 |
| JP | 2004-6801 | 1/2004 |
| JP | 2004-134466 | 4/2004 |
| JP | 2004-343017 | 12/2004 |
| JP | 2004343017 A * | 12/2004 |
| KR | 2003-0072104 | 9/2003 |
| KR | 2003-0081144 | 10/2003 |

* cited by examiner

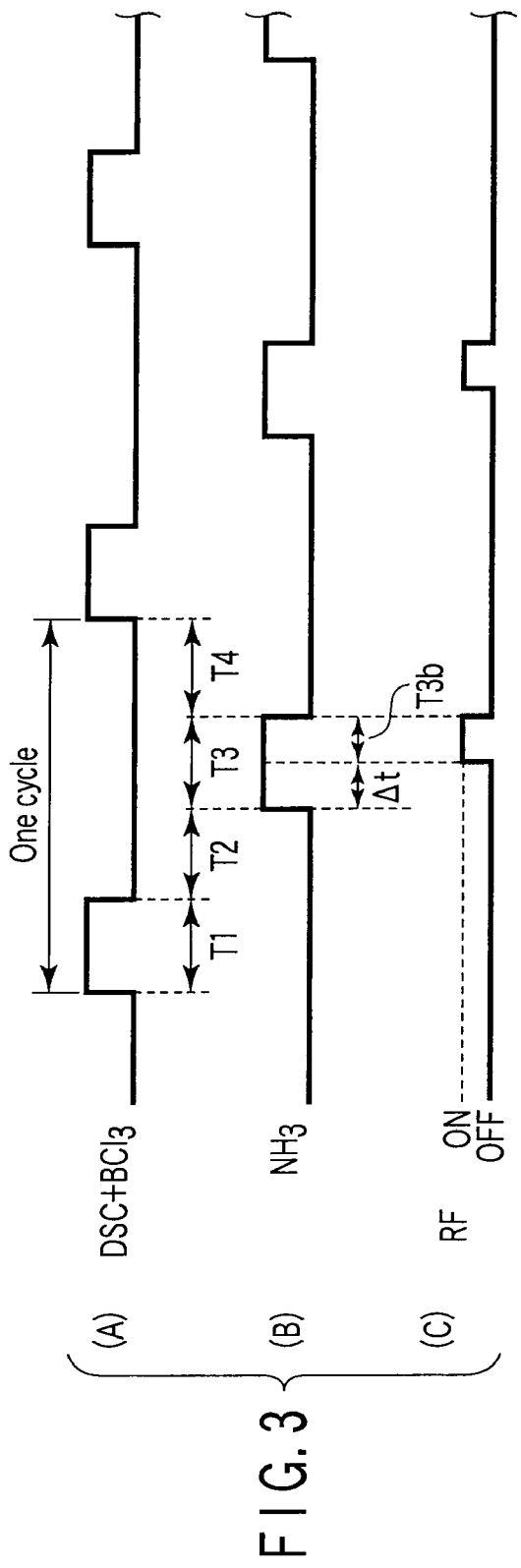
F I G. 3

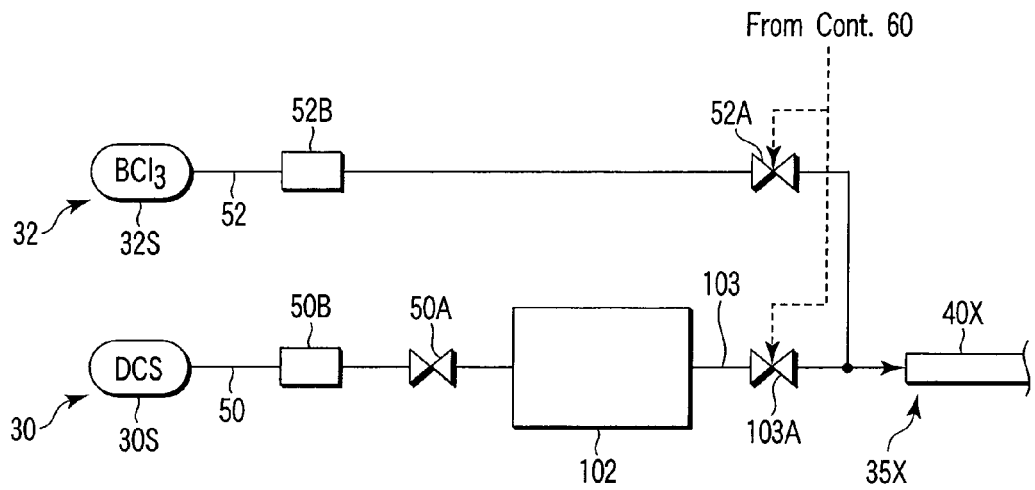
F I G. 5
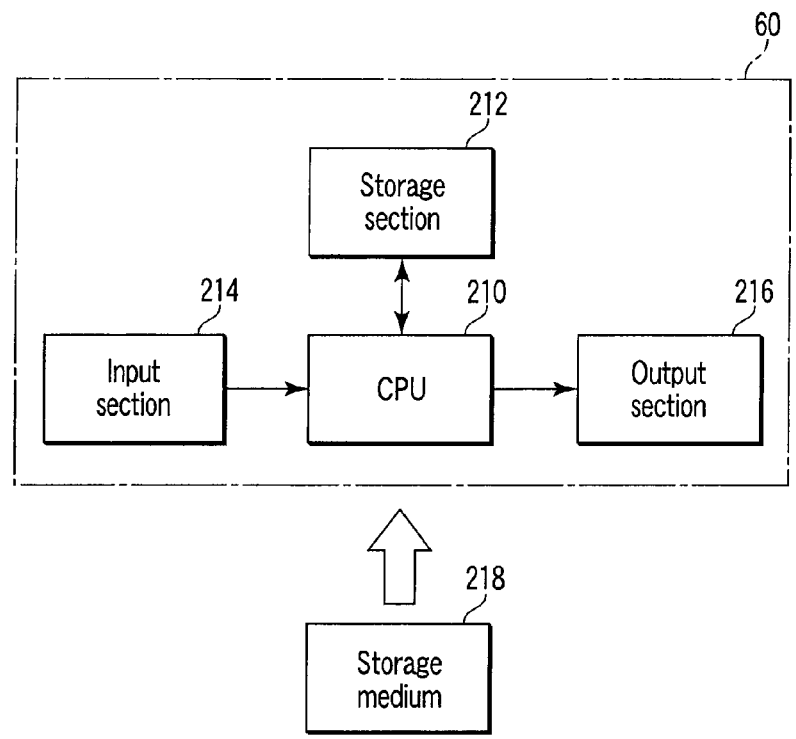
F I G. 6

FILM FORMATION METHOD AND APPARATUS FOR SEMICONDUCTOR PROCESS

CROSS-REFERENCE TO RELATED APPLICATIONS

This application is a division of and is based upon and claims the benefit of priority under 35 U.S.C. §120 for U.S. Ser. No. 11/367,339, filed Mar. 6, 2006, and claims the benefit of priority under 35 U.S.C. §119 from Japanese Patent Application No. 2005-070034, filed Mar. 11, 2005; and Japanese Patent Application No. 2006-004192, filed Jan. 11, 2006, the entire contents of both of which are incorporated herein by reference.

BACKGROUND OF THE INVENTION

1. Field of the Invention

The present invention relates to a film formation apparatus and method for a semiconductor process for forming a thin film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. Jpn. Pat. Appln. KOKAI Publication No. 2004-6801 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rate, process pressure, and process temperature, are controlled.

Conventionally, silicon oxide films ($SiO_2$ films) are mainly used as insulating films for semiconductor devices. However, in recent years, owing to the demands of increased integration and miniaturization of semiconductor integrated circuits, silicon nitride films ($Si_3N_4$ films) are used in place of silicon oxide films, as needed (Jpn. Pat. Appln. KOKAI Publication No. 2004-6801). For example, silicon nitride films are disposed as films resistant to oxidation, films for preventing impurity diffusion, and sidewall films of gate electrode structures. Since silicon nitride films provide a low coefficient of impurity diffusion and a good barrier property against oxidation, they are very suitable as insulating films for the purpose described above. Further, boron nitride films (BN films) have also attracted attention for the same reasons.

For example, where dichlorosilane (DCS) and $NH_3$ are supplied as a silane family gas and a nitriding gas, respectively, to form a silicon nitride film (SiN), the process is performed, as follows. Specifically, DCS and $NH_3$ gas are alternately and intermittently supplied into a process container with purge periods interposed therebetween. When $NH_3$ gas is supplied, an RF (radio frequency) is applied to generate plasma within the process container so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

On the other hand, in recent years, increasing the operation speed of semiconductor devices is also an important factor. In this respect, silicon nitride films have a relatively high dielectric constant, which increases parasitic capacitance and thus is problematic. Specifically, with an increase in parasitic capacitance, the mobility of electrons is suppressed, so the device operation speed decreases. Further, where a silicon nitride film is used for a sensor of the charge storage type, there is a problem in that parasitic capacitance increases a background level.

Under the circumstances, it has been proposed to dope a silicon nitride film with an impurity, so as to decrease the dielectric constant while maintaining the impurity diffusion coefficient and oxidation barrier property. U.S. Pat. No. 6,815,350 discloses a method of forming a silicon nitride film doped with boron (B) as an impurity, by CVD (Chemical Vapor Deposition). Silicon nitride films doped with boron (SiBN) have not only a low coefficient of impurity diffusion and a good barrier property against oxidation, but also a very low dielectric constant, so they are very useful as insulating films.

However, as described later, the present inventors have found that, where a process gas in a small amount, such as a doping gas, is used in conventional vertical heat-processing apparatuses (of the so-called batch type), the inter-substrate uniformity in the composition of deposited films tends to be deteriorated.

BRIEF SUMMARY OF THE INVENTION

An object of the present invention is to provide an apparatus and method for a semiconductor process, which can uniformly supply a process gas in a small amount, such as a doping gas, into a process container in the vertical direction, thereby improving the inter-substrate uniformity in the composition of deposited films.

According to a first aspect of the present invention, there is provided a film formation apparatus for a semiconductor process, comprising:

a process container having a process field configured to accommodate a plurality of target substrates stacked at intervals;

a support member configured to support the target substrates inside the process field;

a heater configured to heat the target substrates inside the process field;

an exhaust system configured to exhaust gas inside the process field;

a process gas supply system configured to supply process gases to the process field so as to deposit a thin film on the target substrates, wherein the process gases include a first process gas for providing a main material of the thin film, a second process gas for reacting with the first process gas, and a third process gas for providing a sub-material of the thin film;

a control section configured to control an operation of the apparatus including the process gas supply system, wherein the process gas supply system comprises a gas mixture tank disposed outside the process container and configured to mix the first and third process gases to form a mixture gas, a mixture gas supply line configured to supply the mixture gas from the gas mixture tank to the process field, first and third process gas supply circuits configured to supply the first and third process gases to the gas mixture tank, respectively, a second process gas supply circuit having a second process gas supply line configured to supply the second process gas to the process field without passing through the gas mixture tank, first and second switching valves disposed on the mixture gas supply line and the second process gas supply line, respectively, and wherein the control section controls the first and second switching valves to be opened and closed so as to alternately and pulse-wise supply the mixture gas from the gas mixture tank and the second process gas from the second process gas supply circuit to the process field.

According to a second aspect of the present invention, there is provided a film formation apparatus for a semiconductor process, comprising:

a process container having a process field configured to accommodate a plurality of target substrates stacked at intervals;

a support member configured to support the target substrates inside the process field;

a heater configured to heat the target substrates inside the process field;

an exhaust system configured to exhaust gas inside the process field;

a process gas supply system configured to supply process gases to the process field so as to deposit a thin film on the target substrates, wherein the process gases include a first process gas for providing a main material of the thin film, a second process gas for reacting with the first process gas, and a third process gas for providing a sub-material of the thin film, and the third process gas is supplied to the process field in an amount smaller than that of the first process gas;

a control section configured to control an operation of the apparatus including the process gas supply system, wherein the process gas supply system comprises a mixture gas supply line configured to mix the first and third process gases to form a mixture gas and supply the mixture gas to the process field, first and third process gas supply circuits having first and third process gas supply lines configured to supply the first and third process gases to the mixture gas supply line, respectively, a second process gas supply circuit having a second process gas supply line configured to supply the second process gas to the process field without passing through the mixture gas supply line, first, second, and third switching valves disposed on the first, second, and third process gas supply lines, respectively, a first tank disposed on the first process gas supply line immediately before the first switching valve to temporarily store the first process gas, and wherein the control section controls the first, second, and third switching valves to be opened and closed so as to alternately and pulse-wise supply the mixture gas from the mixture gas supply line and the second process gas from the second process gas supply circuit to the process field.

According to a third aspect of the present invention, there is provided a film formation method for a semiconductor process, comprising:

heating a plurality of target substrates stacked at intervals within a process field in a process container; and supplying process gases to the process field to deposit a thin film on the target substrates, wherein the process gases include a first process gas for providing a main material of the thin film, a second process gas for reacting with the first process gas, and a third process gas for providing a sub-material of the thin film, wherein said supplying the process gases comprises supplying the first and third process gases to a gas mixture tank disposed outside the process container to form a mixture gas, supplying the mixture gas from the gas mixture tank to the process field, and supplying the second process gas to the process field without passing through the gas mixture tank, so as to alternately and pulse-wise supply the mixture gas and the second process gas to the process field.

According to a fourth aspect of the present invention, there is provided a film formation method for a semiconductor process, comprising:

heating a plurality of target substrates stacked at intervals within a process field in a process container; and supplying process gases to the process field to deposit a thin film on the target substrates, wherein the process gases include a first process gas for providing a main material of the thin film, a second process gas for reacting with the first process gas, and a third process gas for providing a sub-material of the thin film, and the third process gas is supplied to the process field in an amount smaller than that of the first process gas, wherein said supplying the process gases comprises supplying the first and third process gases to a mixture gas supply line to form a mixture gas and supply the mixture gas to the process field, while temporarily storing the first process gas in a first tank disposed immediately before the mixture gas supply line, and supplying the second process gas to the process field without passing through the mixture gas supply line, so as to alternately and pulse-wise supply the mixture gas and the second process gas to the process field.

According to a fifth aspect of the present invention, there is provided a computer readable medium containing program instructions for execution on a processor, which, when executed by the processor, cause a film formation apparatus for a semiconductor process to execute heating a plurality of target substrates stacked at intervals within a process field in a process container; and supplying process gases to the process field to deposit a thin film on the target substrates, wherein the process gases include a first process gas for providing a main material of the thin film, a second process gas for reacting with the first process gas, and a third process gas for providing a sub-material of the thin film, wherein said supplying the process gases comprises supplying the first and third process gases to a gas mixture tank disposed outside the process container to form a mixture gas, supplying the mixture gas from the gas mixture tank to the process field, and supplying the second process gas to the process field without passing through the gas mixture tank, so as to alternately and pulse-wise supply the mixture gas and the second process gas to the process field.

According to a sixth aspect of the present invention, there is provided a computer readable medium containing program instructions for execution on a processor, which, when executed by the processor, cause a film formation apparatus for a semiconductor process to execute heating a plurality of target substrates stacked at intervals within a process field in a process container; and supplying process gases to the process field to deposit a thin film on the target substrates, wherein the process gases include a first process gas for providing a main material of the thin film, a second process gas for reacting with the first process gas, and a third process gas for providing a sub-material of the thin film, and the third process gas is supplied to the process field in an amount smaller than that of the first process gas, wherein said supplying the process gases comprises supplying the first and third process gases to a mixture gas supply line to form a mixture gas and supply the mixture gas to the process field, while temporarily storing the first process gas in a first tank disposed immediately before the mixture gas supply line, and supplying the second process gas to the process field without passing through the mixture gas supply line, so as to alternately and pulse-wise supply the mixture gas and the second process gas to the process field.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a timing chart of the gas supply and RF (radio frequency) application of a film formation method according to a first embodiment;

FIG. 5 is a view showing part of a gas supply system used in a film formation apparatus according to a modification of the second embodiment; and FIG. 6 is a block diagram schematically showing the structure of a main control section.

DETAILED DESCRIPTION OF THE INVENTION

Figure 1:
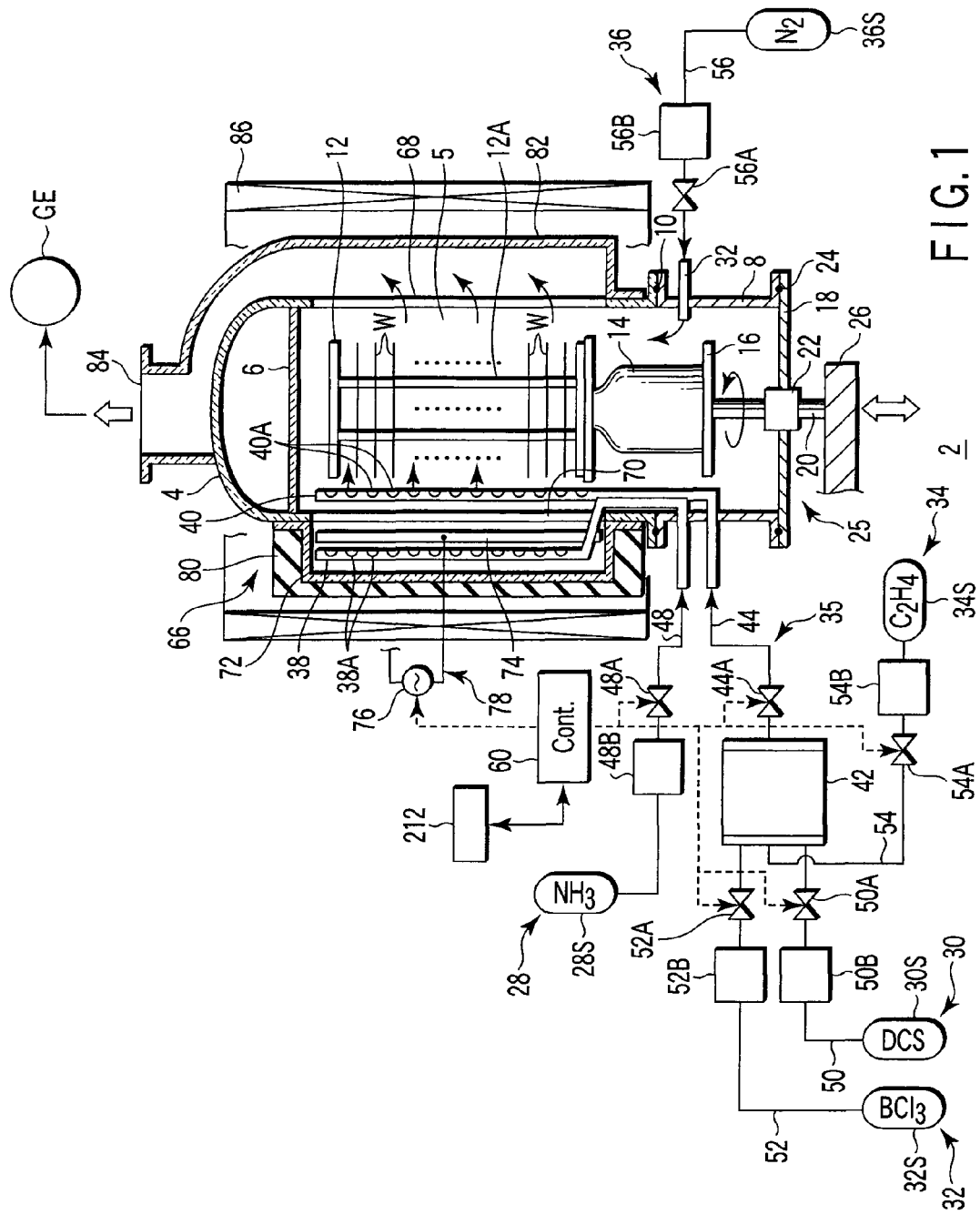
FIG. 1 is a sectional view showing a film formation apparatus (vertical CVD apparatus) according to a first embodiment of the present invention.

In the process of developing the present invention, the inventors studied problems caused in conventional film formation apparatuses for a semiconductor process, where a plurality of source gases were used to perform a film formation process, such as a process for forming a thin film doped with an impurity. As a result, the inventors have arrived at the findings given below.

Specifically, where a plurality of source gases are used to perform a film formation process, it is important to control the ratio of film composition elements of to be a predetermined value, so as to attain high film quality. However, for example, where the source gases includes a main source gas containing a main component element of a deposition film and a doping gas, the supply amount of the doping gas is far smaller than the supply amount of the main source gas, in general. In this case, since the supply amount of the doping gas supplied into a vertical process container is small, a problem arises such that an element derived from the doping gas is taken into deposited films on wafers in varying amounts, depending on the wafer position in the vertical direction. Consequently, the inter-substrate uniformity in the composition of the deposited films tends to be lower. This problem is caused due to differences in the adsorptivity of the source gas relative to the wafer surface and in the flow rate of the source gases.

For this reason, where the supply amount of a gas, such as a doping gas, supplied into a vertical process container is small, countermeasures are required to supply the gas at a uniform supply amount in the vertical direction. For example, a gas nozzle having a number of gas spouting holes at predetermined intervals is disposed to extend in the longitudinal direction of the vertical process container, and the doping gas is delivered from the holes. Alternatively, the supply time of the doping gas is shortened to increase the flow rate of the gas per unit time. However, even with the former countermeasure, where a very small gas supply amount is handled, the flow rate from gas spouting holes at the upstream side tends to be higher than the flow rate from gas spouting holes at the downstream side. In this respect, it is not easy to optimize the dimensions and so forth of gas spouting holes, so as to uniformize the flow rate from the gas spouting holes, for a small gas supply amount.

Further, where the supply amount of a gas, such as a doping gas, is very small, the gas can be mixed with an inactive carrier gas to increase the total flow rate, as a countermeasure. In this case, however, due to the presence of the carrier gas, the partial pressure of the doping gas decreases and thus the adsorption rate of the doping gas decreases by that much.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

Figure 2:
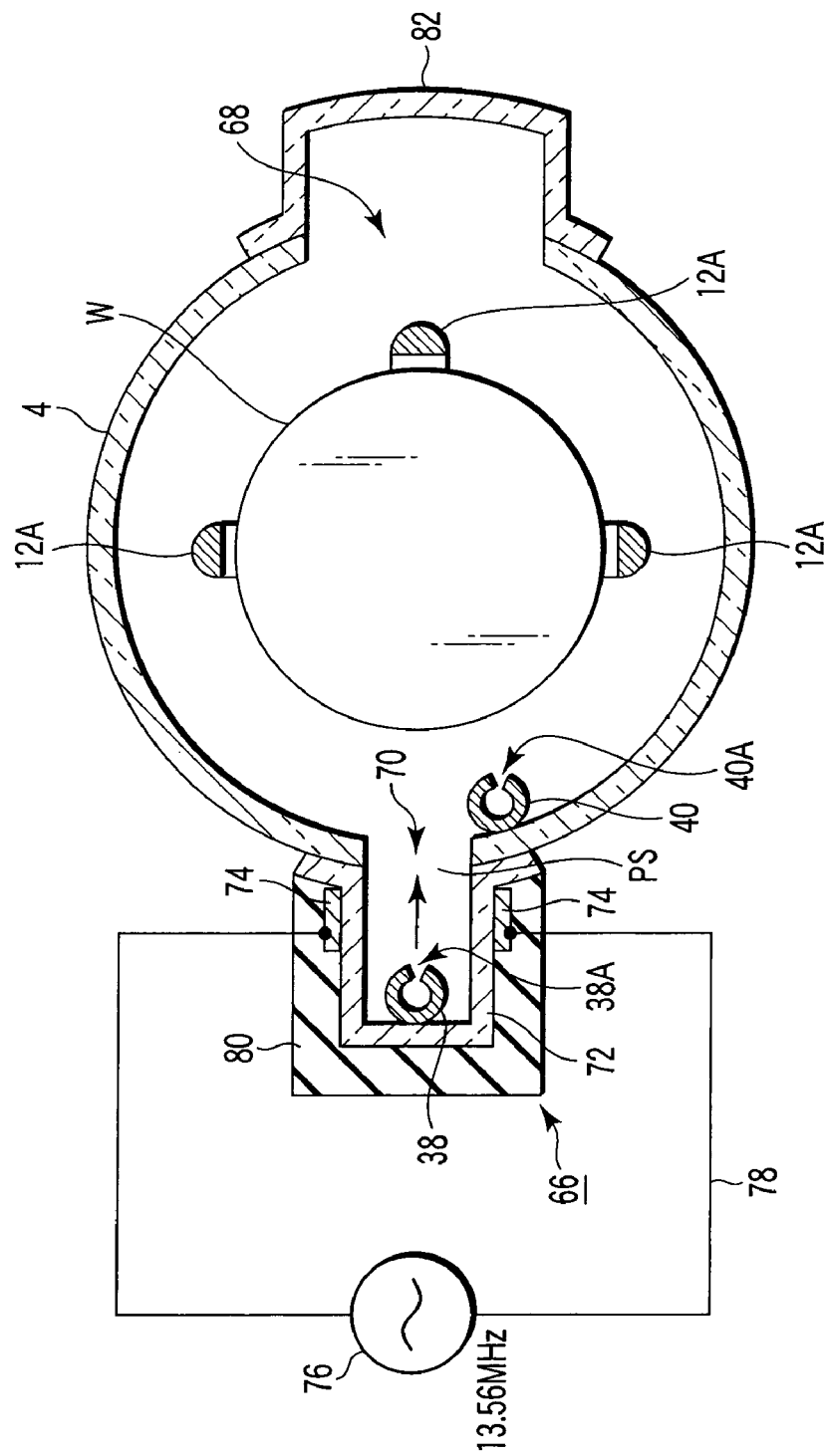
FIG. 2 is a sectional plan view showing part of the apparatus shown in FIG. 1.

FIG. 1 is a sectional view showing a film formation apparatus (vertical CVD apparatus) according to a first embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silane family gas, a second process gas containing ammonia ($NH_3$) gas as a nitriding gas, and a third process gas containing $BCl_3$ gas as a boron-containing gas. The film formation apparatus 2 is configured to form an SiBN (boron doped silicon nitride) film on target substrates by CVD in the process field. Accordingly, the boron-containing gas is used as a doping gas. The process field is further configured to be selectively supplied with a fourth process gas containing $C_2H_4$ gas (ethylene gas) as a carbon hydride gas, as needed.

The apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply system is connected to the side of the manifold 8 to supply predetermined process gases to the process field 5 within the process container 4. Specifically, the gas supply system includes a second process gas supply circuit 28, a first process gas supply circuit 30, a third process gas supply circuit 32, and a purge gas supply circuit 36, and, as needed, a fourth process gas supply circuit 34. The first process gas supply circuit 30 is arranged to supply a first process gas containing a silane family gas, such as DCS (dichlorosilane) gas. The second process gas supply circuit 28 is arranged to supply a second process gas containing a nitriding gas, such as ammonia ($NH_3$) gas. The third process gas supply circuit 32 is arranged to supply a third process gas containing a boron-containing gas (doping gas), such as $BCl_3$ gas. The fourth process gas supply circuit 34 is arranged to supply a fourth process gas containing a carbon hydride gas, such as $C_2H_4$ gas (ethylene gas). The purge gas supply circuit 36 is arranged to supply an inactive gas, such as $N_2$ gas, as a purge gas. Each of the first, second, and fourth process gases is mixed with a suitable amount of carrier gas, as needed. However, such a carrier gas will not be mentioned, hereinafter, for the sake of simplicity of explanation.

More specifically, the first, third, and fourth process gas supply circuits 30, 32, and 34 are connected to a common mixture gas supply circuit 35. The mixture gas supply circuit 35 has a gas mixture tank configured to mix the first and third process gases, and further the fourth process gas in addition thereto, as needed. The gas mixture tank 42 is designed to have a volume for uniformly mixing the gases and temporarily store a sufficient supply amount of the mixture gas, such as a volume of, e.g., about four liters (to be changed depending on the gas flow rate). The gas mixture tank 52 is connected to a gas distribution nozzle 40 formed of a quartz pipe through a mixture gas supply line 44 provided with a switching valve 44A. On the other hand, the second process gas supply circuit 28 is connected to a gas distribution nozzle 38 formed of a quartz pipe.

The gas distribution nozzles 38 and 40 penetrate the sidewall of the manifold 8 from the outside and then turn and extend upward. The gas distribution nozzles 38 and 40 respectively have a plurality of gas spouting holes 38A and 40A, each set of holes being formed at predetermined intervals in the longitudinal direction (the vertical direction) over all the wafers W on the wafer boat 12. Each of the gas spouting holes 38A and 40A delivers the corresponding process gas almost uniformly in the horizontal direction, so as to form gas flows parallel with the wafers W on the wafer boat 12. The purge gas supply circuit 36 includes a short gas nozzle 46, which penetrates the sidewall of the manifold 8 from the outside.

The gas mixture tank 52 is connected to gas sources 30S, 32S, and 34S of DCS gas, $BCl_3$ gas, and $C_2H_4$ gas, respectively, through gas supply lines (gas passages) 50, 52, and 54 of the first, third, and fourth process gas supply circuits 30, 32, and 34, respectively. The gas distribution nozzle 38 of the second process gas supply circuit 28 is connected to a gas source 28S of $NH_3$ gas through a gas supply line (gas passage) 48. The nozzle 46 of the purge gas supply circuit 36 is connected to a gas source 36S of $N_2$ gas through gas supply lines (gas passage) 56. The gas supply lines 48, 50, 52, 54, and 56 are provided with switching valves 48A, 50A, 52A, 54A, and 56A and flow rate controllers 48B, 50B, 52B, 54B, and 56B, such as mass flow controllers, respectively. With this arrangement, $NH_3$ gas, DCS gas, $BCl_3$ gas, $C_2H_4$ gas, and $N_2$ gas can be supplied at controlled flow rates.

A gas exciting section 66 is formed at the sidewall of the process container 4 in the vertical direction. On the side of the process container 4 opposite to the gas exciting section 66, a long and thin exhaust port 68 for vacuum-exhausting the inner atmosphere is formed by cutting the sidewall of the process container 4 in, e.g., the vertical direction.

Specifically, the gas exciting section 66 has a vertically long and thin opening 70 formed by cutting a predetermined width of the sidewall of the process container 4, in the vertical direction. The opening 70 is covered with a quartz cover 72 airtightly connected to the outer surface of the process container 4 by welding. The cover 72 has a vertical long and thin shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction.

A pair of long and thin electrodes 74 are disposed on the opposite outer surfaces of the cover 72, and face each other along the longitudinal direction (the vertical direction). The electrodes 74 are connected to an RF (Radio Frequency)

power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzle 38 of the second process gas is bent outward in the radial direction of the process container 4, at a position lower than the lowermost wafer W on the wafer boat 12. Then, the gas distribution nozzle 38 vertically extends at the deepest position (the farthest position from the center of the process container 4) in the gas exciting section 66. As shown also in FIG. 2, the gas distribution nozzle 38 is separated outward from an area sandwiched between the pair of electrodes 74 (a position where the RF electric field is most intense), i.e., a plasma generation area PS where the main plasma is actually generated. The second process gas containing $NH_3$ gas is spouted from the gas spouting holes 38A of the gas distribution nozzle 38 toward the plasma generation area PS. Then, the second process gas is excited (decomposed or activated) in the plasma generation area PS, and is supplied in this state onto the wafers W on the wafer boat 12.

An insulating protection cover 80 made of, e.g., quartz is attached on and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At a position near and outside the opening 70 of the gas exciting section 66, the gas distribution nozzle 40 of the mixture gas supply circuit 35 is disposed to vertically extend upward. The mixture gas (a mixture gas of the first and third process gases, and further the fourth process gas in addition thereto, as needed) is spouted from the gas spouting holes 40A of the gas distribution nozzle 40 toward the center of the process container 4.

On the other hand, the exhaust port 68, which is formed opposite the gas exciting section 66, is covered with an exhaust port cover member 82. The exhaust port cover member 82 is made of quartz with a U-shape cross-section, and attached by welding. The exhaust cover member 82 extends upward along the sidewall of the process container 4, and has a gas outlet 84 at the top of the process container 4. The gas outlet 84 is connected to a vacuum-exhaust system GE including a vacuum pump and so forth.

The process container 4 is surrounded by a heater 86, which is used for heating the atmosphere within the process container 4 and the wafers W. A thermocouple (not shown) is disposed near the exhaust port 68 in the process container 4 to control the heater 86.

The film formation apparatus 2 further includes a main control section 60 formed of, e.g., a computer, to control the entire apparatus. The main control section 60 can control the film formation process described below in accordance with the process recipe of the film formation process concerning, e.g., the film thickness and composition of a film to be formed, stored in the memory 212 thereof in advance. In the memory 212, the relationship between the process gas flow rates and the thickness and composition of the film is also stored as control data in advance. Accordingly, the main control section 60 can control the elevating mechanism 25, gas supply circuits 28, 30, 32, 34, 35 and 36, exhaust system GE, gas exciting section 66, heater 86, and so forth, based on the stored process recipe and control data.

Next, an explanation will be given of a film formation method (so called ALD (Atomic Layer Deposition) film formation) performed in the apparatus shown in FIG. 1. In this film formation method, an insulating film of SiBN is formed on semiconductor wafers by CVD. In order to achieve this, a first process gas containing dichlorosilane (DCS) gas as a silane family gas, a second process gas containing ammonia ($NH_3$) gas as a nitriding gas, and a third process gas containing $BCl_3$ gas as a boron-containing gas are selectively supplied into the process field 5 accommodating wafers W. At this time, the first process gas and third process gas are mixed in the gas mixture tank 42, and the mixture gas thus formed is supplied into the process field. It should be noted that this film formation method is an example where a fourth process gas containing $C_2H_4$ gas (ethylene gas) as a carbon hydride gas is not supplied.

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the first to third process gases are intermittently supplied from the respective gas distribution nozzles 38 and 40 at controlled flow rates.

Specifically, the first process gas containing DCS gas and the third process gas containing $BCl_3$ gas are supplied into the gas mixture tank 42 to form a mixture gas. The mixture gas is supplied from the gas spouting holes 40A of the gas distribution nozzle 40 to form gas flows parallel with the wafers W on the wafer boat 12. While being supplied, molecules of DCS gas and $BCl_3$ gas and molecules and atoms of decomposition products generated by their decomposition are adsorbed on the wafers W.

On the other hand, the second process gas containing $NH_3$ gas is supplied from the gas spouting holes 38A of the gas distribution nozzle 38 to form gas flows parallel with the wafers W on the wafer boat 12. The second process gas is selectively excited and partly turned into plasma when it passes through the plasma generation area PS between the pair of electrodes 74. At this time, for example, radicals (activated species), such as N*, NH*, $NH_2$*, and $NH_3$*, are produced (the symbol [*] denotes that it is a radical). The radicals flow out from the opening 70 of the gas exciting section 66 toward the center of the process container 4, and are supplied into gaps between the wafers W in a laminar flow state.

The radicals react with molecules of DCS gas adsorbed on the surface of the wafers W, so that a thin film is formed on the wafers W. Further, at this time, B atoms generated by decomposition of $BCl_3$ gas are taken into the thin film, so a film of SiBN doped with boron as an impurity is formed. Alternatively, when DCS gas and $BCl_3$ gas flow onto radicals adsorbed on the surface of the wafers W, the same reaction is caused, so an SiBN film doped with boron is formed on the wafers W.

FIG. 3 is a timing chart of the gas supply and RF (radio frequency) application of a film formation method according to the first embodiment. As shown in FIG. 3, the film formation method according to this embodiment is arranged to alternately repeat first to fourth steps T1 to T4. A cycle comprising the first to fourth steps T1 to T4 is repeated a number of times, and thin films of SiBN formed by respective cycles are laminated, thereby arriving at an SiBN film having a target thickness.

Specifically, the first step T1 is arranged to perform supply of the mixture gas of the first process gas (denoted as DCS in FIG. 3) and the third process gas (denoted as $BCl_3$ in FIG. 3) to the process field 5, while stopping supply of the second process gas (denoted as $NH_3$ in FIG. 3) to the process field 5. The second step T2 is arranged to stop supply of the mixture gas of the first and third process gases and the second process gas to the process field 5. The third step T3 is arranged to perform supply of the second process gas to the process field 5, while stopping supply of the mixture gas of the first and third process gases to the process field 5. Further, halfway through the third step T3, the RF power supply 76 is set in the ON state to turn the second process gas into plasma by the gas exciting section 66, so as to supply the second process gas in an activated state to the process field 5 during a sub-step T3b. The fourth step T4 is arranged to stop supply of the mixture gas of the first and third process gases and the second process gas to the process field 5.

In the third step T3, the RF power supply 76 is turned on after a predetermined time Δt passes, to turn the second process gas into plasma by the gas exciting section 66, so as to supply the second process gas in an activated state to the process field 5 during the sub-step T3b. The predetermined time Δt is defined as the time necessary for stabilizing the flow rate of $NH_3$ gas, which is set at, e.g., about 5 seconds. However, the second process gas may be turned into plasma by the gas exciting section 66 over the entire period of supplying the second process gas. Since the RF power supply is turned on to generate plasma after the flow rate of the second process gas is stabilized, the uniformity of radical concentration among the wafers W (uniformity in the vertical direction) is improved.

Each of the second and fourth steps T2 and T4 is used as a purge step to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while stopping supply of all the gases. In this respect, the second and fourth steps T2 and T4 may be arranged such that the first half utilizes only vacuum-exhaust and the second half utilizes both vacuum-exhaust and inactive gas supply. Further, the first and third steps T1 and T3 may be arranged to stop vacuum-exhausting the process container 4 while supplying each of the first to third process gases. However, where supplying each of the first to third process gases is performed along with vacuum-exhausting the process container 4, the interior of the process container 4 can be continuously vacuum-exhausted over the entirety of the first to fourth steps T1 to T4.

In FIG. 3, the first step T1 is set to be within a range of about 1 to 20 seconds, and, for example, at about 10 seconds, the second step T2 is set to be within a range of about 5 to 15 seconds, and, for example, at about 10 seconds, the third step T3 is set to be within a range of about 1 to 30 seconds, and, for example, at about 20 seconds, the sub-step T3b is set to be within a range of about 1 to 25 seconds, and, for example, at about 10 seconds, and the fourth step T4 is set to be within a range of about 5 to 15 seconds, and, for example, at about 10 seconds. In general, the film thickness obtained by one cycle of the first to fourth steps T1 to T4 is about 0.11 to 0.13 nm. Accordingly, for example, where the target film thickness is 70 nm, the cycle is repeated about 600 times. However, these values of time and thickness are merely examples and thus are not limiting.

The process conditions of the film formation process are as follows. The flow rate of DCS gas is set to be within a range of 50 to 2,000 sccm, e.g., at 1,000 sccm (1 slm). The flow rate of $NH_3$ gas is set to be within a range of 500 to 5,000 sccm, e.g., at 1,000 sccm. The flow rate of $BCl_3$ gas is set to be within a range of 1 to 15 sccm, e.g., at 2 sccm. Accordingly, the flow rate of $BCl_3$ gas is far smaller than the flow rate of DCS gas.

The process temperature is lower than ordinary CVD processes, and is set to be within a range of 300 to 700° C., and preferably a range of 550 to 630° C. If the process temperature is lower than 300° C., essentially no film is deposited because hardly any reaction is caused. If the process temperature is higher than 700° C., a low quality CVD film is deposited, and existing films, such as a metal film, suffer thermal damage.

The process pressure is set to be within a range of 13 Pa (0.1 Torr) to 1,330 Pa (10 Torr), and preferably a range of 40 Pa (0.3 Torr) to 266 Pa (2 Torr). For example, the process pressure is set at 1 Torr during the first step (adsorption step) T1, and at 0.3 Torr during the third step (nitridation step using plasma) T3. If the process pressure is lower than 13 Pa, the film formation rate becomes lower than the practical level. If the process pressure is higher than 1,330 Pa, it becomes difficult to generate plasma.

As described above, the first process gas containing DCS gas for providing the main material of a thin film, and the third process gas containing $BCl_3$ gas for providing a sub-material of the thin film are uniformly mixed at first in the gas mixture tank 42 to form a mixture gas. The mixture gas is then intermittently supplied into the process field 5 through a plurality of gas spouting holes 40A arrayed at intervals in the vertical direction. In this case, although the amount of $BCl_3$ gas is small, it can be essentially uniformly distributed within the process container 4 in the vertical direction without using a carrier gas. Consequently, the ratio of the composition elements in SiBN thin films to be formed becomes more uniform, regardless of wafer position.

In other words, the supply amount of the third process gas is far smaller than the supply amount of the first process gas. In this case, the third process gas in a smaller supply amount is made to accompany the first process gas in a larger supply amount, so that it can be uniformly distributed within the process container 4 in the vertical direction. Particularly, where the supply amount of one source gas is 1/100 or less of the supply amount of the other source gas, the above-described effect of uniformizing the ratio of the composition elements in films is more influential.

When $BCl_3$ gas is adsorbed on the wafer surface, the adsorption amount depends on the partial pressure of $BCl_3$ gas. According to this embodiment, $BCl_3$ gas is supplied into the process container 4 uniformly in the vertical direction without using a carrier gas. In this case, the partial pressure of $BCl_3$ gas can be higher than that in the case of a carrier gas being used, so adsorption of $BCl_3$ gas on the wafer surface is promoted. Consequently, while the film formation rate per unit cycle is maintained, the time necessary for one cycle is shortened, so the throughput is improved.

For example, in an experiment, a conventional film formation method took about 15 seconds until $BCl_3$ gas was sufficiently adsorbed on a wafer surface. On the other hand, the present embodiment took only two or three seconds for the same. Accordingly, the conventional method took about 30 seconds for one cycle, while the present embodiment shortened this period to only 8 seconds.

Typically, the mixture gas may be formed and supplied by either of the following two methods. The first method comprises continuously supplying the first and third process gases from the first and third process gas supply circuits 30 and 32 into the gas mixture tank 42, while supplying the mixture gas pulse-wise from the gas mixture tank 42 into the process field 5. The second method comprises simultaneously supplying the first and third process gases pulse-wise in a first phase from the first and third process gas supply circuits 30 and 32 into the gas mixture tank 42, while supplying the mixture gas pulse-wise in a second phase reverse to the first phase from the gas mixture tank 42 into the process field 5.

In order to realize these methods, the switching valves 50A and 52A of the first and third process gas supply circuits 30 and 32 and the switching valve 44A of the mixture gas supply circuit 35 are opened and closed in accordance with instructions from the main control section 60, as follows. In the first method, over a plurality of cycles from the start to the end of the film formation process, the switching valves 50A and 52A are kept opened and the switching valve 44A is opened and closed pulse-wise. In the second method, over a plurality of cycles from the start to the end of the film formation process, the switching valves 50A and 52A are opened and closed pulse-wise while the switching valve 44A is closed and opened pulse-wise in the reverse phase.

In the film formation method described above, the fourth process gas containing $C_2H_4$ gas (ethylene gas) as a carbon hydride gas is not supplied, but the fourth process gas may be supplied, as needed. In this case, the fourth process gas is supplied into the gas mixture tank 42 at a controlled flow rate, simultaneously with the first and third process gases. Where a mixture gas of the first, third, and fourth process gases is used, a thin film to be formed is an insulating film of SiBCN (boron doped silicon carbon nitride) containing carbon.

Second Embodiment

Figure 4:
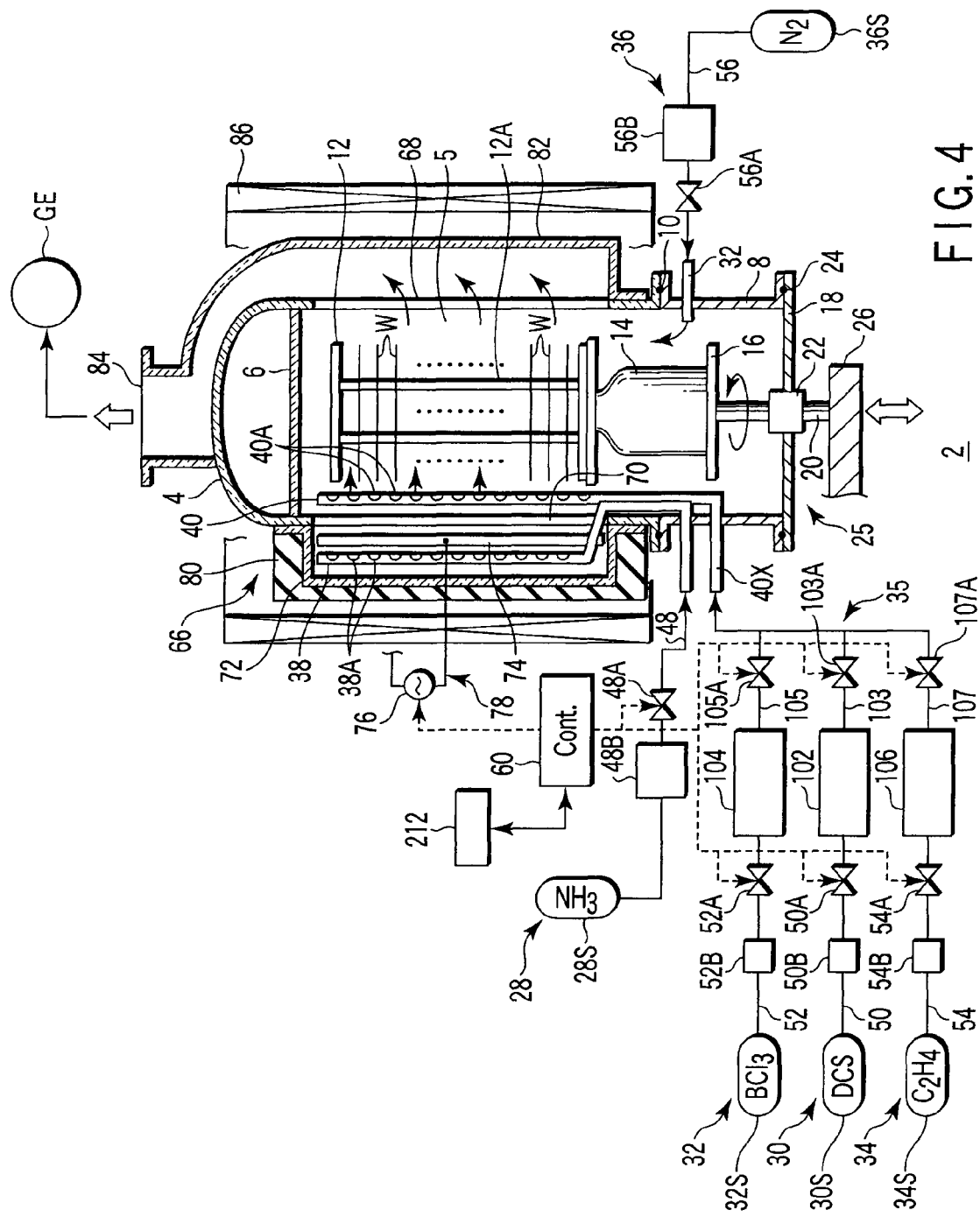
FIG. 4 is a sectional view showing a film formation apparatus (vertical CVD apparatus) according to a second embodiment of the present invention.

FIG. 4 is a sectional view showing a film formation apparatus (vertical CVD apparatus) according to a second embodiment of the present invention. This film formation apparatus 2X has the same structure as the film formation apparatus 2 shown in FIG. 1 except for the first, third, and fourth process gas supply circuits 30, 32, and 34 and the mixture gas supply circuit 35. Accordingly, an explanation will be give of the film formation apparatus 2X, focusing on the difference from the film formation apparatus 2.

In the film formation apparatus 2X, the first, third, and fourth process gas supply circuits 30, 32, and 34 are connected to a common mixture gas supply circuit 35X. The mixture gas supply circuit 35X includes a mixture gas supply pipe 40X configured to mix the first and third process gases, and further the fourth process gas in addition thereto, as needed. The mixture gas supply pipe 40X is formed of a quartz pipe, which is a proximal end portion of a gas distribution nozzle 40.

The first, third, and fourth process gas supply circuits 30, 32, and 34 have tanks 102, 104, and 106, respectively, disposed immediately before the mixture gas supply pipe 40X to temporarily store the corresponding process gases. Since the tanks 102 and 106 need to handle a large gas flow rate, they are larger than the tank 104. For example, each of the tanks 102 and 106 has a volume of about four liters, while the tank 104 has a volume of about 0.05 liters (both to be changed depending on the gas flow rate). The tanks 102, 104, and 106 are connected to the mixture gas supply pipe 40X through gas supply lines 103, 105, and 107 provided with switching valves 103A, 105A, and 107A, respectively.

The tanks 102, 104, and 106 of the first, third, and fourth process gas supply circuits 30, 32, and 34 are connected to gas sources 30S, 32S, and 34S of DCS gas, $BCl_3$ gas, and $C_2H_4$ gas, respectively, through gas supply lines (gas passages) 50, 52, and 54. The gas supply lines 50, 52, and 54 are provided with switching valves 50A, 52A, and 54A and flow rate controllers 50B, 52B, and 54B, such as mass flow controllers, respectively. With this arrangement, DOS gas, $BCl_3$ gas, and $C_2H_4$ gas can be supplied at controlled flow rates.

Next, an explanation will be given of a film formation method (so called ALD (Atomic Layer Deposition) film formation) performed in the apparatus shown in FIG. 4. It should be noted that this film formation method is also an example where a fourth process gas containing $C_2H_4$ gas (ethylene gas) as a carbon hydride gas is not supplied. The gas supply and RF (radio frequency) application of this film formation method are performed in accordance with the timing chart shown in FIG. 3. At this time, in order to form and supply a mixture gas (denoted as DCS+$BCl_3$ in FIG. 3), the switching valves 103A and 105A are simultaneously opened and closed to supply first and third process gases temporarily stored in the tanks 102 and 104 into the mixture gas supply pipe 40X and mix them in the pipe 40X. The mixture gas is supplied from the gas spouting holes 40A of the gas distribution nozzle 40 to form gas flows parallel with the wafers W on the wafer boat 12. As a consequence, this apparatus can provide the same operation and effect as those obtained in the apparatus shown in FIG. 1.

Typically, the mixture gas may be formed and supplied by either of the following two methods (also in the following explanation, the fourth process gas is not supplied). The first method comprises continuously supplying the first and third process gases into the respective tanks 102 and 104 of the first and third process gas supply circuits 30 and 32, while supplying the gases pulse-wise from the respective tanks 102 and 104 into the mixture gas supply pipe 40X. The second method comprises simultaneously supplying the first and third process gases pulse-wise in a first phase into the respective tanks 102 and 104 of the first and third process gas supply circuits 30 and 32, while supplying the gases pulse-wise in a second phase reverse to the first phase from the respective tanks 102 and 104 into the mixture gas supply pipe 40X.

In order to realize these methods, the switching valves 50A and 52A of the first and third process gas supply circuits 30 and 32 and the switching valves 103A and 105A downstream from the tanks are opened and closed in accordance with instructions from the main control section 60, as follows. In the first method, over a plurality of cycles from the start to the end of the film formation process, the switching valves 50A and 52A are kept opened and the switching valves 103A and 105A are opened and closed pulse-wise. In the second method, over a plurality of cycles from the start to the end of the film formation process, the switching valves 50A and 52A are opened and closed pulse-wise while the switching valves 103A and 105A are closed and opened pulse-wise in the reverse phase.

FIG. 5 is a view showing part of a gas supply system used in a film formation apparatus according to a modification of the second embodiment (the fourth process gas supply circuit is not shown). In this modification, the tank 104 of the third process gas supply circuit 32 is omitted because the flow rate of the third process gas containing $BCl_3$ gas is far smaller than the flow rate of the first process gas containing DCS gas. Even with this arrangement, the third process gas in a smaller amount is made to be uniformly mixed with the first process gas in a larger amount within the mixture gas supply pipe 40X, so that the third process gas is uniformly supplied.

Common Matters to First and Second Embodiments

Each of the methods according to the first and second embodiments is performed under the control of the main control section 60 in accordance with a process program, as described above. FIG. 6 is a block diagram schematically showing the structure of the main control section 60. The main control section 60 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 6 also shows a storage medium 218 attached to the computer in a removable state.

Each of the methods according to the first and second embodiments may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described above.

In the embodiments described above, for example, the exciting section 66 for generating plasma of the film formation apparatus 2 is integrally combined with the process container 4. Alternatively, the exciting section 66 may be separately disposed from the process container 4, so as to excite $NH_3$ gas outside the process container 4 (so called remote plasma), and then supply the excited $NH_3$ gas into the process container 4. Further, $NH_3$ gas may be supplied without being activated, and, in this case, the members associating with the gas exciting section 66 are not necessary. However, in this case, the process temperature needs to be increased to some extent to compensate for energy decrease due to no plasma being used.

In the embodiments described above, for example, the distribution nozzle 40 having a number of gas spouting holes 40A is used as a nozzle for supplying the mixture gas. Alternatively, a linear or straight pipe similar to the gas nozzle 46, or a bent or L-shaped pipe may be used for the same purpose. Where the straight pipe or L-shaped pipe is used, the mixture gas is supplied from below or above the process field 5. In this case, an exhaust port 68 is formed at the top or bottom of the process container 4 to cause the mixture gas to sufficiently flow within the process field 5 in the vertical direction.

In the embodiments described above, for example, the first process gas contains DCS gas as a silane family gas. In this respect, the silane family gas may be one or more gases selected from the group consisting of dichlorosilane (DCS), hexachlorodisilane (HCD), monosilane ($SiH_4$), disilane ($Si_2Cl_6$), hexamethyl-disilazane (HMDS), tetrachlorosilane (TCS), disilylamine (DSA), trisilylamine (TSA), bistertial-butylaminosilane (BTBAS).

In the embodiments described above, the second process gas contains a nitriding gas, which may be $NH_3$ gas or $N_2$ gas. Where the present invention is applied to formation of a film based on silicon oxynitride, an oxynitriding gas, such as dinitrogen oxide ($N_2O$) or nitrogen oxide (NO), may be used in place of the nitriding gas. In this case, a film to be formed is a film based on silicon oxynitride that contains oxygen (O).

In the embodiments described above, for example, the third process gas contains $BCl_3$ gas as a boron-containing gas. In this respect, the boron-containing gas may be one or more gases selected from the group consisting of $BCl_3$, $B_2H_6$, $BF_3$, and $B(CH_3)_3$.

In the embodiments described above, for example, the fourth process gas contains ethylene gas as a carbon hydride gas. In this respect, the carbon hydride gas may be one or more gases selected from the group consisting of acetylene, ethylene, methane, ethane, propane, and butane.

In the embodiments described above, for example, an SiBN film or SiBCN film is formed. Alternatively, for example, the present invention may be applied to a process for forming a BCN film (carbon-containing boron nitride film). In this case, a boron-containing gas and a carbon hydride gas are used as source gases and mixed. The present invention can be applied to various film formation processes which use a plurality of source gases that does not cause any problem if they are mixed before being supplied into a process container. For example, the present invention may be applied to a film formation process using an oxidizing gas, such as $O_2$ gas, as a reaction gas.

A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for forming a silicon nitride film in a film formation apparatus, the method comprising:

a stage of preparing the film formation apparatus such that the apparatus includes a process container having a process field configured to accommodate a plurality of target substrates stacked at intervals, a support member configured to support the target substrates inside the process field, a heater configured to heat the target substrates inside the process field, an exhaust system configured to exhaust gas from inside the process field, a process gas supply system configured to supply process gases to the process field so as to deposit a silicon nitride film on the target substrates, wherein the process gases include a silicon source gas, a nitriding gas, and a doping gas, and a control section configured to control an operation of the apparatus including the process gas supply system, wherein the process gas supply system includes a first gas distribution nozzle and a second gas distribution nozzle extending in vertical directions inside the process container and respectively having a first group of gas spouting holes and a second group of gas spouting holes formed thereon at predetermined intervals in the vertical directions over the process field, the first and second groups of gas spouting holes being configured to spout gas in lateral directions to form gas flows parallel with the target substrates on the support member, an exciting mechanism including a plasma generation area disposed in a space communicating with the process field and between the second group of gas spouting holes of the second gas distribution nozzle and the target substrates, a gas mixture tank disposed outside the process container and configured to mix the silicon source gas and the doping gas to form a mixture gas, a mixture gas supply line configured to supply the mixture gas from the gas mixture tank to the first gas distribution nozzle, first and third gas supply lines configured to supply the silicon source gas and the doping gas from a first supply source of the silicon source gas and a third supply source of the doping gas to the gas mixture tank, respectively, a second gas supply line configured to supply the nitriding gas from a second supply source of the nitriding gas to the second gas distribution nozzle without passing through the gas mixture tank, and first and second switching valves disposed on the mixture gas supply line and the second gas supply line, respectively, the first switching valve being present outside the process container and between the gas mixture tank and the first gas distribution nozzle; and a stage of then conducting a film formation sequence to form a silicon nitride film on a plurality of product substrates under the control of the control section, the film formation sequence comprising:

heating the product substrates placed on the support member within the process field in the process container;

forming the mixture gas by continuously supplying the silicon source gas and the doping gas respectively from the first and third supply sources to the gas mixture tank with the silicon source gas set at a flow rate of 50 to 2,000 sccm and the doping gas set at a flow rate of 1 to 15 sccm;

supplying the mixture gas pulse-wise from the gas mixture tank through the first group of gas spouting holes of the first gas distribution nozzle to the process field while performing said forming the mixture gas; and supplying the nitriding gas pulse-wise from the second supply source through the second group of gas spouting holes of the second gas distribution nozzle to the process field without passing through the gas mixture tank, said supplying the nitriding gas including activating the nitriding gas by generating plasma by use of the exciting mechanism, while controlling the first and second switching valves to be opened and closed so as to alternately and pulse-wise supply the mixture gas from the gas mixture tank and the nitriding gas from the second supply source to the process field a plurality of times, and keeping the first switching valve closed during said forming the mixture gas except for said supplying the mixture gas pulse-wise.

2. The film formation method according to claim 1, wherein the doping gas is supplied to the process field in an amount 1/100 or less of the silicon source gas.

3. The film formation method according to claim 1, wherein the silicon source gas contains a silane family gas selected from the group consisting of dichlorosilane, hexachlorodisilane, and tetrachlorosilane.

4. The film formation method according to claim 1, wherein the film formation apparatus is prepared such that the process gas supply system further includes a fourth gas supply line configured to supply a carbon hydride gas from a fourth supply source to the gas mixture tank, the fourth supply source being disposed outside the process container and storing the carbon hydride gas, and the film formation sequence further comprises supplying the carbon hydride gas from the fourth supply source to the gas mixture tank simultaneously with the silicon source gas and the doping gas to mix the carbon hydride gas in the mixture gas.

5. The film formation method according to claim 3, wherein the nitriding gas is ammonia gas, and the doping gas contains at least one gas selected from the group consisting of $BCl_3$, $B_2H_6$, $BF_3$, and $B(CH_3)_3$.

6. The film formation method according to claim 1, wherein the film formation sequence further includes exhausting gas from the process filed without supplying either of the mixture gas and the nitriding gas to the process field between said supplying the mixture gas and said supplying the nitriding gas.

7. The film formation method according to claim 6, wherein said exhausting gas from the process filed includes supplying an inactive gas to the process filed.

8. The film formation method according to claim 4, wherein the nitriding gas is ammonia gas and the carbon hydride gas is ethylene gas.

9. A film formation method for forming a silicon nitride film containing carbon in a film formation apparatus, the method comprising:

a stage of preparing the film formation apparatus such that the apparatus includes a process container having a process field configured to accommodate a plurality of target substrates stacked at intervals, a support member configured to support the target substrates inside the process field, a heater configured to heat the target substrates inside the process field, an exhaust system configured to exhaust gas from inside the process field, a process gas supply system configured to supply process gases to the process field so as to deposit a silicon nitride film on the target substrates, wherein the process gases include a silicon source gas, a nitriding gas, a doping gas, and a carbon hydride gas, and a control section configured to control an operation of the apparatus including the process gas supply system, wherein the process gas supply system includes a first gas distribution nozzle and a second gas distribution nozzle extending in vertical directions inside the process container and respectively having a first group of gas spouting holes and a second group of gas spouting holes formed thereon at predetermined intervals in the vertical directions over the process field, the first and second groups of gas spouting holes being configured to spout gas in lateral directions to form gas flows parallel with the target substrates on the support member, an exciting mechanism including a plasma generation area disposed in a space communicating with the process field and between the second group of gas spouting holes of the second gas distribution nozzle and the target substrates a gas mixture tank disposed outside the process container and configured to mix the silicon source gas, the doping gas, and the carbon hydride gas to form a mixture gas, a mixture gas supply line configured to supply the mixture gas from the gas mixture tank to the first gas distribution nozzle, first, third and fourth gas supply lines configured to supply the silicon source gas, the doping gas, and the carbon hydride gas from a first supply source of the silicon source gas, a third supply source of the doping gas, and a fourth supply source of the carbon hydride gas to the gas mixture tank, respectively, a second gas supply line configured to supply the nitriding gas from a second supply source of the nitriding gas to the second gas distribution nozzle without passing through the gas mixture tank, and first and second switching valves disposed on the mixture gas supply line and the second gas supply line, respectively, the first switching valve being present outside the process container and between the gas mixture tank and the first gas distribution nozzle; and a stage of then conducting a film formation sequence to form a silicon nitride film on a plurality of product substrates under the control of the control section, the film formation sequence comprising:

heating the product substrates placed on the support member within the process field in the process container;

forming the mixture gas by continuously supplying the silicon source gas, the doping gas, and the carbon hydride gas respectively from the first, third and fourth supply sources to the gas mixture tank with the silicon source gas set at a flow rate of 50 to 2,000 sccm and the doping gas set at a flow rate of 1 to 15 sccm;

supplying the mixture gas pulse-wise from the gas mixture tank through the first group of gas spouting holes of the first gas distribution nozzle to the process field while performing said forming the mixture gas; and supplying the nitriding gas pulse-wise from the second supply source through the second group of gas spouting holes of the second gas distribution nozzle to the process field without passing through the gas mixture tank, said supplying the nitriding gas including activating the nitriding gas by generating plasma by use of the exciting mechanism, while controlling the first and second switching valves to be opened and closed so as to alternately and pulse-wise supply the mixture gas from the gas mixture tank and the nitriding gas from the second supply source to the process field a plurality of times, and keeping the first switching valve closed during said forming the mixture gas except for said supplying the mixture gas pulse-wise.

10. The film formation method according to claim 9, wherein the doping gas is supplied to the process field in an amount $\frac{1}{100}$ or less of the silicon source gas.

11. The film formation method according to claim 9, wherein the film formation sequence further includes exhausting gas from the process filed without supplying either of the mixture gas and the nitriding gas to the process field between said supplying the mixture gas and said supplying the nitriding gas.

12. The film formation method according to claim 11, wherein said exhausting gas from the process filed includes supplying an inactive gas to the process filed.

13. The film formation method according to claim 9, wherein the nitriding gas is ammonia gas and the carbon hydride gas is ethylene gas.

14. The film formation method according to claim 13, wherein the silicon source gas contains a silane family gas selected from the group consisting of dichlorosilane, hexachlorodisilane, and tetrachlorosilane.

* * * * *